United States Patent

Vrijheid et al.

[11] Patent Number: 5,638,001
[45] Date of Patent: Jun. 10, 1997

[54] MAGNETIC RESONANCE APPARATUS INCLUDING A MONITOR

[75] Inventors: Johan E. W. Vrijheid; Dirk Sinnema; Nico M. M. Swennen, all of Eindhoven, Netherlands

[73] Assignee: U.S. Philips Corporation, New York, N.Y.

[21] Appl. No.: 620,678

[22] Filed: Mar. 19, 1996

[30] Foreign Application Priority Data

Mar. 22, 1995 [EP] European Pat. Off. ............ 95200698

[51] Int. Cl.$^6$ ............................................. G01V 3/00
[52] U.S. Cl. ........................................ 324/318; 324/322
[58] Field of Search ............................... 324/318, 319, 324/322; 128/653.5

[56] References Cited

U.S. PATENT DOCUMENTS

| | | | |
|---|---|---|---|
| 4,641,135 | 2/1987 | Hilbrink | 340/784 |
| 5,032,831 | 7/1991 | Kuijk | 340/784 |
| 5,076,275 | 12/1991 | Bechor et al. | 324/318 |
| 5,150,710 | 9/1992 | Hall et al. | 324/318 |
| 5,151,691 | 9/1992 | Kuijk | 340/784 |
| 5,384,537 | 1/1995 | Ito et al. | 324/318 |
| 5,402,786 | 4/1995 | Drummond | 324/318 |
| 5,432,544 | 7/1995 | Ziarati | 324/318 |

FOREIGN PATENT DOCUMENTS 0498528  8/1992  European Pat. Off. .

Primary Examiner—Louis M. Arana
Attorney, Agent, or Firm—Jack D. Slobod

[57] ABSTRACT

A magnetic resonance apparatus includes a magnet system (2) for generating a steady magnetic field (H) in a measuring space (28), an RF receiver circuit (10, 14, 16) with an RF receiver coil (10) for receiving RF signals emitted by an object arranged in the measuring space, a monitor (22) with a liquid crystal display (LCD) display screen (44) for image display, and a central control unit (18) which is connected to the RF receiver circuit and to the monitor for control in such a manner that information is applied to the LCD display screen. In order to prevent disturbing RF signals, produced by the monitor (22), from affecting the information obtained via the RF receiver circuit (10, 14, 16), the central control unit (18) is arranged to control the monitor in such a manner that information is applied to the LCD display screen (44) only during periods in which the RF receiver circuit is not activated. Generally speaking, the monitor (22) includes a signal processing unit (38) which is arranged to convert an image signal received on its input (40) into a screen signal suitable for supply to the LCD display screen (44) and to make this image signal available on its output (42). The output (42) of the signal processing unit (38) is then preferably connected to the LCD display screen (44) via a controllable switching unit (54), a control input (56) of which is connected to the central control unit (18).

4 Claims, 2 Drawing Sheets

MAGNETIC RESONANCE APPARATUS INCLUDING A MONITOR

BACKGROUND OF THE INVENTION

1. Field of the Invention

The invention relates to a magnetic resonance apparatus, including a magnet system for generating a steady magnetic field in a measuring space, a gradient circuit with a gradient coil system for generating gradient fields in the measuring space, an RF transmitter circuit with an RF transmitter coil for applying RF energy to an object to be arranged in the measuring space, an RF receiver circuit with an RF receiver coil for receiving RF signals emitted by the object, a monitor with a liquid crystal display (LCD) screen for image display, and a central control unit which is connected on the one side to at least the gradient circuit, the RF transmitter circuit and the RF receiver circuit in order to superpose magnetic field gradients, preselected by the gradient circuit, on the steady magnetic field, to activate the RF transmitter circuit and to activate the RF receiver circuit for a predetermined period thereafter, and connected on the other side to the monitor in order to control it in such a manner that information is applied to the LCD display screen.

2. Description of the Related Art

An apparatus of this kind is known from EP-A-0 498 528. The monitor of the known apparatus serves to display an image of the object examined, for example a patient, which has been acquired by way of magnetic resonance. Because the monitor is arranged in the vicinity of the measuring space and produces disturbing RF radiation during operation, it is positioned outside an RF shielding cage which shields the room in which the MR apparatus is installed. As a result, the disturbing RF radiation cannot penetrate the activated RF receiver circuit via the RF receiver coil. Because the operating staff, and possibly the patient, must be able to observe the images displayed on the monitor, the shielding cage should be provided with a protrusion which projects as far as the vicinity of the apparatus and, moreover, the part of the shielding cage wherebehind the display screen is situated must be transparent. Constructing a shielding cage including such a protrusion is complex and expensive. Moreover, even though a part of the shielding cage can be constructed so as to be transparent, generally speaking such a transparent part offers poor shielding against RF radiation. Similar objections would apply if the monitor were accommodated in a separate shielding cage arranged in the room in which the MR apparatus is installed.

SUMMARY OF THE INVENTION

It is an object of the invention to improve a magnetic resonance apparatus of the kind set forth in such a manner that at least the display screen of the monitor can be arranged in the vicinity of the measuring space, even if it is not provided with a shield against RF radiation. To this end, the apparatus in accordance with the invention is characterized in that the central control unit is arranged to control the monitor in such a manner that information is applied to the LCD display screen only during periods in which the RF receiver circuit is not activated.

The invention is based on the recognition of the fact that the cells constituting an LCD display screen have a capacitive memory in which the image can be retained for a brief period of time (for example, one or two seconds) without signals being applied to the cell. The capacitive memory may be formed by the intrinsic capacitance of the LCD cell itself, like in the devices described in, for example U.S. Pat. No. 4,641,135, U.S. Pat. No. 5,032,831, U.S. Pat. No. 5,151,691, or may consist of a combination of this intrinsic capacitance and an external capacitance as described in U.S. Pat. No. 3,532,813. The capacitive memory of the LCD cell can retain the image information for a period of time which is substantially longer than the period during which the RF receiver circuit must be activated. Consequently, the RF circuit can be activated and the image information in the LCD display screen refreshed in an alternating fashion. The image information in the LCD display screen is refreshed preferably during the periods during which the RF transmitter circuit is activated. Thus, disturbing electric pulses, occurring during the refreshment of the image information, do not affect the RF receiver circuit which is inactive at that instant. A suitable method for interrupting the information stream to the LCD display screen is to suppress the formation of the signals normally formed in the monitor so as to control the display screen. However, this may form a comparatively far-reaching intervention in the operation of the monitor.

Generally speaking, a monitor includes a signal processing unit which is arranged to convert an image signal received on its input into a screen signal suitable for supply to the LCD display screen and to make this screen signal available on its output. A preferred embodiment of the apparatus in accordance with the invention which includes a monitor thus constructed is characterized in that the output of the signal processing unit is connected to the LCD display screen via a controllable switching unit, a control input of which is connected to the central control unit. The addition of said switching unit represents a simple modification of the monitor and makes it suitable for use in the apparatus in accordance with the invention. An apparatus including a monitor thus modified is preferably characterized in that the signal processing unit is shielded from the measuring space by means of an RF shielding cage and that the input of the signal processing unit is connected, via an optical fibre, to a device for generating image signals. The signal processing unit may then be continuously activated, without disturbing RF radiation being applied to the RF receiver circuit. As in the known apparatus, the device for generating image signals may be a device for forming an image of the object being examined, said image being acquired by the MR apparatus itself. It may also be, for example a device which produces a graphic representation of signals occurring during the tuning of the RF receiver coil. A further embodiment of the apparatus in accordance with the invention is characterized in that the device for generating image signals is connected to an apparatus for measuring physiological quantities. Such an apparatus may be arranged, for example to measure a patient's respiration or electrical cardiac activity.

These and other aspects of the invention will be apparent from and elucidated with reference to the embodiments described hereinafter.

DETAILED DESCRIPTION OF THE PREFERRED EMBODIMENTS

Figure 1:
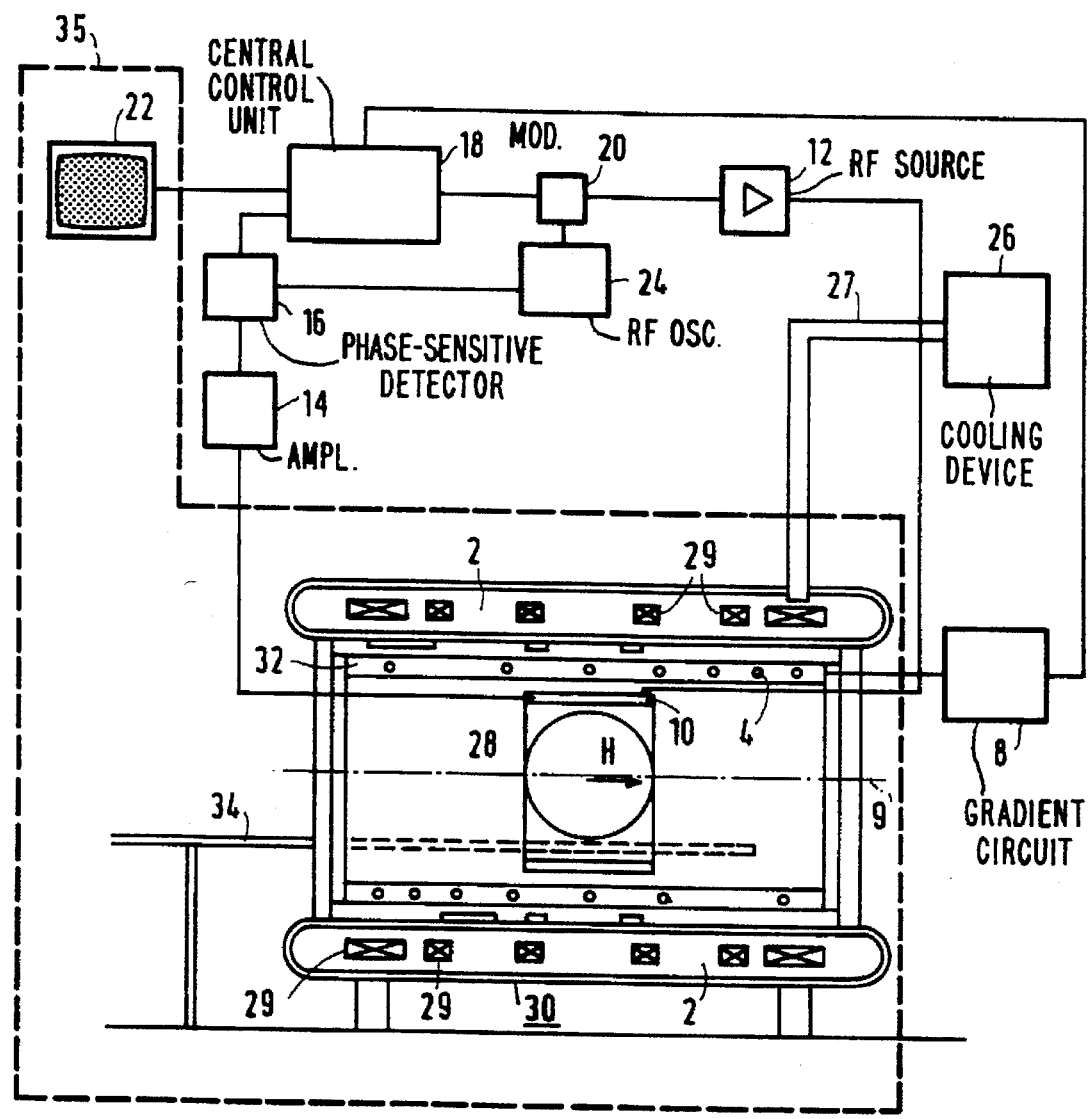
FIG. 1 shows diagrammatically an embodiment of a magnetic resonance apparatus in accordance with the invention.

An embodiment of a magnetic resonance apparatus as shown in FIG. 1 comprises an essentially cylindrical magnet system 2 for generating a steady, uniform magnetic field H and a likewise cylindrical gradient coil system 4 which serves to generate magnetic gradient fields and which forms part of a gradient circuit 8. The magnet system 2 and the gradient coil system 4 have a common axis 9. An RF coil 10 serves to generate an RF magnetic alternating field and is connected to an RF source 12 for this purpose. The RF coil 10 can also be used for the detection of spin resonance signals generated by the RF transmitted field in an object to be examined; to this end, this coil is connected to a signal amplifier 14. The signal amplifier 14 is connected to a phase-sensitive detector 16 which is connected to a central control unit 18. The RF coil 10, the signal amplifier 14 and the phase-sensitive rectifier 16 together constitute an RF receiver circuit. Moreover, in conjunction with the RF source 12 and a modulator 20 connected thereto, the RF coil 10 constitutes an RF transmitter circuit. The central control unit 18 may include, for example a suitably programmed microprocessor and also controls the modulator 20, the gradient circuit 8 and a monitor 22 for image display. An RF oscillator 24 controls the modulator 20 as well as the phase-sensitive rectifier 16 which processes the measuring signals. For the cooling of the magnet coils 2 for generating the main field H there is provided a cooling device 26 with cooling ducts 27. The RF coil 10, being essentially cylindrical and coaxially arranged within the magnet systems 2 and 4 in the present embodiment, encloses a measuring space 28 which is arranged to accommodate an object to be examined; in an apparatus for medical diagnostic measurements, the space is large enough to accommodate a patient to be examined. Thus, a uniform magnetic field H, gradient fields selecting object slices, and a spatially uniform RF alternating field can be generated in the measuring space 28. In this case the RF coil 10 is assumed to combine the functions of RF transmitter coil and RF receiver coil. Separate coils can alternatively be used for the two functions; for example, surface coils are used as receiver coils. These coils are preferably cylindrical, but need not necessarily be so.

The magnet system 2 is in this case formed by six coils 29 of the same diameter which are accommodated as superconducting coils in a dewar vessel 30 with liquid helium which is connected to the cooling device 26. A gradient coil holder 32, supporting the gradient coils 4, is arranged within the coils 29 for the main field H in a customary manner. A patient table 34 which is displaceable in the axial direction is provided so as to position an object to be examined, for example a patient, in the measuring space 28. The magnet system 2 and the gradient coil system 4 may have a completely different shape, for example as described in the cited document EP-A-0 498 582. The magnet system 2 is accommodated in a room which is RF shielded by means of a Faraday cage 35. The monitor 22 is also present in this room.

During operation the central control unit 18 controls the gradient circuit 8 in such a manner that preselected magnetic field gradients are superposed on the steady magnetic field H. Subsequently, the RF transmitter circuit 20, 12, 10 is activated, so that RF energy is applied to an object arranged in the measuring space 28. Subsequently, the RF receiver circuit 10, 14, 16 is activated for a predetermined period of time so as to detect the spin resonance signals emitted by the object. The signals emitted by the object contain information concerning the inside of the object. The central control unit 18 can reconstruct an image of the inside of the object therefrom, which image can be displayed by means of the monitor 22, if desired. To this end, the monitor 22 comprises a display screen with a liquid crystal display (LCD display screen) as described in, for example U.S. Pat. No. 4,641,135, U.S. Pat. No. 5,032,831, (PHN 12.154), U.S. Pat. No. 5,151,691 (PHN 13.150) or U.S. Pat. No. 3,532,813. In this case the central control unit 18 thus supplies the information for the image to be displayed by the monitor 22. In addition, the central control unit 18 is capable of controlling various functions relating to the operation of the monitor 22. One of these functions is the supply of information to the LCD display screen. In accordance with the invention, the central control unit 18 is arranged to control this function of the monitor 22 in such a manner that information is applied to the LCD display screen only during periods in which the RF receiver circuit 10, 14, 16 is not activated.

Figure 2:
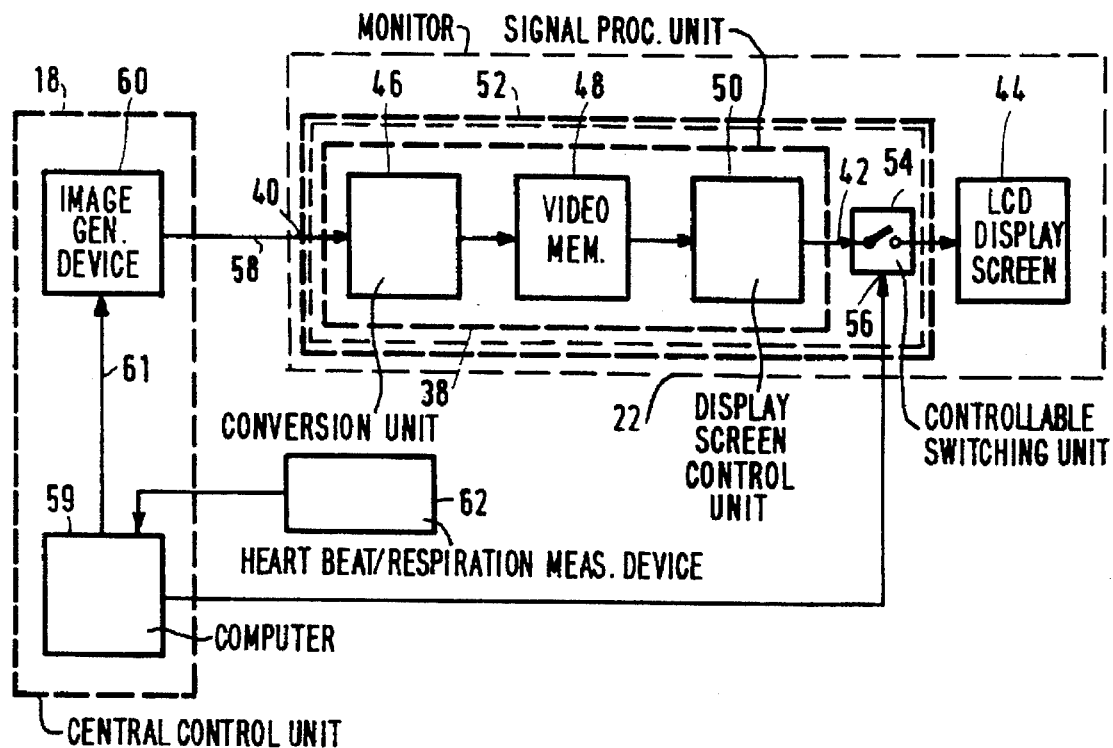
FIG. 2 shows a block diagram of a monitor suitable for use in the apparatus shown in FIG. 1.

FIG. 2 shows a block diagram of an embodiment of the monitor 22. It includes a signal processing unit 38 which is arranged to convert the image signal received on its input 40 into a screen signal which can be applied, via its output 42, to the LCD display screen 44. A suitable type of display screen is the active matrix display bearing the type number LDH096T-11 from FPD Company. The signal processing unit 38 preferably includes successively a conversion unit 46 for converting the image signal into a video signal, a video memory 48 for storing the video signal, and a display screen control unit 50 for forming the screen signal which is suitable for controlling the LCD display screen 44. The signal processing unit 38 is shielded from the measuring space 28 (see FIG. 1) by means of an RF shielding cage 52, for example a Faraday cage. The shielding cage 52 may form part of the housing in which said parts of the signal processing unit 38 are accommodated. The LCD display screen 44 may then be provided on the exterior of said housing. However, it is alternatively possible for the shielding cage 52 to form part of a larger shielding cage (not shown) which shields the magnet system 2 (see FIG. 1) and the coils included therein from disturbing influences. In both cases the connection between the output 42 of the signal processing unit 38 and the LCD display screen 44 passes through the wall of the shielding cage 52. In this connection there is inserted a controllable switching unit 54 which includes a control input 56 connected to the central control unit 18. The switching unit 54 may be composed of one or more known controllable switching elements and is accommodated within the shielding cage 52.

The input 40 of the signal processing unit 38 is connected, via an optical fiber 58, to a device 60 for generating image signals. Via a lead 61, the device 60 is connected to a computer 59 and may form part of the central control unit 18, together with the computer. The optical fiber 58 extends through the wall of the shielding cage 52. The computer 59 may also be connected to an apparatus 62 for measuring physiological quantities. Using such an apparatus, for example the heart beat or the respiration of a patient arranged within the measuring space 28 can be measured. The measuring signals produced by the apparatus 62 can then be convened into image signals by the device 60, said image signals containing a graphic representation of the variation of the physiological quantities. The computer 59 can also provide the device 60, via the lead 61, with data obtained by means of magnetic resonance measurements. The device 60 is then arranged to process these data so as to form an image of the inside of the patient.

Figure 3:
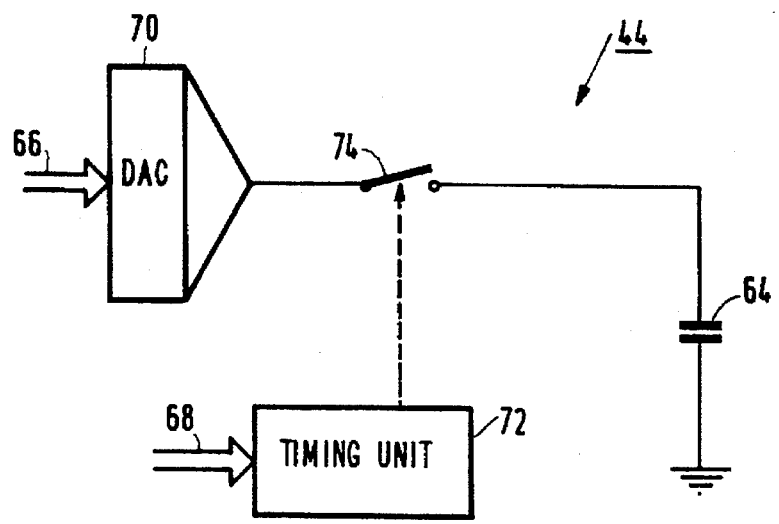
FIG. 3 shows a detail of the monitor shown in FIG. 2.

FIG. 3 shows a detail of the monitor 22 in order to illustrate the control of the LCD cells constituting the LCD display screen 44. As has been described in the cited documents, an LCD display screen 44 consists of a matrix of LCD cells which are arranged in rows and columns. FIG.

3 symbolically shows one of these cells 64 as a capacitor. The screen signal produced by the display screen control unit 50 (FIG. 2) contains, for each LCD cell 64, a stream of image information data (pixel data) 66 and also clock and synchronization signals 68. The pixel data 66 are convened into signals representing grey values for the LCD cell 64 by a digital-to-analog converter (DAC) 70 and the clock and synchronization signals 68 are converted, by a timing unit 72, into a control signal which operates a switch 74 which connects the DAC 70 to the LCD cell 64. The switching unit 54 (FIG. 2) is arranged to interrupt the pixel data 66 and the clock and synchronization signals 68. When the switching unit 54 is activated, therefore, these signals are not applied to the LCD display screen 44. The computer 59 is programmed so that the switching unit 54 is activated before the RF receiver circuit 10, 14, 16 is activated. The image information present in the LCD cells 64 is then retained for some time because of the memory effect of these cells, for example from one to two seconds, so that the image remains visible on the LCD display screen. When the activation of the RF receiver circuit 10, 14, 16 is terminated, the switching elements 72 are closed again so that new information from the device 60 can be displayed on the display screen 44. A substantially instantaneous representation of the physiological parameters or of the inside of the patient can thus be continuously present on the monitor 22 without the monitor exerting a disturbing effect on the RF receiver circuit 10, 14, 16. If desired, the LCD display screen 44 may also be provided with its own, transparent shielding cage (not shown).

We claim:

1. A magnetic resonance apparatus comprising a magnet system for generating a steady magnetic field in a measuring space, a gradient circuit with a gradient coil system for generating gradient fields in the measuring space, an RF transmitter circuit and an RF receiver circuit including RF coil means for applying RF energy to an object to be arranged in the measuring space and for receiving RF signals emitted by the object, a monitor with a liquid crystal display screen for image display, and a central control unit which is connected to at least the gradient circuit, the RF transmitter circuit and the RF receiver circuit in order to superpose magnetic field gradients, preselected by the gradient circuit, on the steady magnetic field, to activate the RF transmitter circuit and to activate the RP receiver circuit for a predetermined period thereafter, and is connected to the monitor in order to control the monitor in such a manner that information it applied to the LCD display screen only during periods in which the RF receiver circuit is not activated.

2. A magnetic resonance apparatus as claimed in claim 1, wherein the monitor includes a signal processing unit, having an input and an output, which is arranged to convert an image signal received on its input into a screen signal suitable for supply to the LCD display screen and to make this screen signal available on its output, said output of the signal processing unit being connected to the LCD display screen via a controllable switching unit having a control input which is connected to the central control unit.

3. A magnetic resonance apparatus as claimed in claim 2, wherein the signal processing unit is shielded from the measuring space by an RF shielding cage and the input of the signal processing unit is connected, via an optical fiber, to a device for generating image signals.

4. A magnetic resonance apparatus as claimed in claim 3, wherein the device for generating image signals is connected to an apparatus for measuring physiological quantities.

* * * * *